United States Patent
Xiong et al.

(10) Patent No.: US 11,934,238 B2
(45) Date of Patent: Mar. 19, 2024

(54) CUSTOMIZED THERMAL THROTTLING USING ENVIRONMENTAL CONDITIONS

(71) Applicant: Western Digital Technologies, Inc., San Jose, CA (US)

(72) Inventors: Shaomin Xiong, Fremont, CA (US); Qian Zhong, Sunnyvale, CA (US); Toshiki Hirano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 103 days.

(21) Appl. No.: 17/327,013

(22) Filed: May 21, 2021

(65) Prior Publication Data

US 2022/0374059 A1    Nov. 24, 2022

(51) Int. Cl.
G06F 1/20      (2006.01)
G06F 11/30    (2006.01)
G11C 5/14     (2006.01)

(52) U.S. Cl.
CPC .......... G06F 1/206 (2013.01); G06F 11/3058 (2013.01); G11C 5/14 (2013.01)

(58) Field of Classification Search
CPC ........ G06F 1/206; G06F 11/3058; G11C 5/14
See application file for complete search history.

(56) References Cited

U.S. PATENT DOCUMENTS

| | | | |
|---|---|---|---|
| 6,021,076 A | 2/2000 | Woo et al. | |
| 8,304,698 B1 | 11/2012 | Tischler | |
| 9,405,356 B1 * | 8/2016 | Sareen | G06F 3/0674 |
| 9,760,311 B1 * | 9/2017 | Amir | G06F 1/3275 |
| 2008/0270691 A1 * | 10/2008 | Belady | G11B 33/142 |
| | | | 711/E12.005 |
| 2009/0052266 A1 * | 2/2009 | Askar | G06F 13/161 |
| | | | 365/212 |
| 2016/0062421 A1 * | 3/2016 | Sugawara | G06F 1/3268 |
| | | | 700/299 |
| 2016/0274629 A1 * | 9/2016 | Lovicott | G06F 1/206 |
| 2016/0320995 A1 * | 11/2016 | Warriner | G06F 1/206 |
| 2016/0378149 A1 * | 12/2016 | Kam | G06F 1/3206 |
| | | | 713/320 |

(Continued)

OTHER PUBLICATIONS

International Search Report and Written Opinion for Application No. PCT/US2022/027231 dated Aug. 25, 2022 (8 pages).

(Continued)

*Primary Examiner* — Vincent H Tran
(74) *Attorney, Agent, or Firm* — Michael Best & Friedrich LLP

(57) ABSTRACT

A data storage device including, in one implementation, a non-volatile memory device having a memory block including a number of memory dies, and a controller coupled to the non-volatile memory device. The controller is configured to monitor a temperature of the data storage device and determine whether the monitored temperature exceeds a first temperature threshold. The controller is also configured to perform a default thermal throttling operation based on the monitored temperature exceeding the first temperature threshold, determine whether the monitored temperature exceeds a second temperature threshold, and perform a customized thermal throttling operation based on the monitored temperature exceeding the second temperature threshold.

14 Claims, 8 Drawing Sheets

(56) References Cited

U.S. PATENT DOCUMENTS

| | | | |
|---|---|---|---|
| 2017/0052551 A1 | 2/2017 | Bang et al. | |
| 2017/0102676 A1* | 4/2017 | Park | G06F 1/206 |
| 2017/0249091 A1* | 8/2017 | Hodes | G06F 1/3296 |
| 2017/0300263 A1* | 10/2017 | Helmick | G06F 3/0679 |
| 2018/0364934 A1* | 12/2018 | Bahirat | G06F 3/0625 |
| 2019/0065388 A1* | 2/2019 | Christensen | G06F 12/0893 |
| 2020/0041355 A1* | 2/2020 | Bahirat | G06F 3/0679 |
| 2020/0097200 A1* | 3/2020 | Striegel | G06F 3/0632 |
| 2020/0225719 A1* | 7/2020 | Scott, III | G06K 7/0017 |
| 2020/0379525 A1* | 12/2020 | Luo | G06F 1/206 |
| 2021/0096775 A1* | 4/2021 | Park | G01K 13/00 |
| 2021/0303211 A1* | 9/2021 | Moon | G06F 3/0679 |

OTHER PUBLICATIONS

NVM Express Workgroup, "NVM Express, Base Specification," Revision 1.4c dated Mar. 9, 2021 (407 pages).

NVM Express Workgroup, "NVM Express," Revision 1.3a dated Oct. 24, 2017 (287 pages).

\* cited by examiner

CUSTOMIZED THERMAL THROTTLING USING ENVIRONMENTAL CONDITIONS

FIELD

This application relates generally to data storage devices, and more particularly, to a controller that optimizes thermal throttling of the data storage device in response to changes in temperature based on one or more model estimations.

BACKGROUND

Generally, data storage devices adhere to known or preset thermal throttling control schemes. However, these general or preset control schemes do not take other environmental factors, such as external cooling (e.g. cooling fans, heat sinks, etc.) into account when throttling the performance of the memory device. Rather, the thermal throttling is simply applied to quickly cool down the data storage device when one or more temperature thresholds are exceeded. These preset thermal throttling control schemes do not take into account the application or working condition into which the data storage device is operating. For or example, a data storage device installed in a server farm may have access to more efficient cooling, and therefore may be able to operate at higher internal temperatures, while a data storage device installed in a personal computer "PC" or laptop is not able to be as efficiently cooled. By using preset thermal throttling schemes, efficient usage of the data storage devices in different applications is not able to be realized without specific changes being made to one or more of the preset thermal throttling schemes.

SUMMARY

General thermal throttling techniques utilized by data storage devices do not account for different applications or the surrounding environment of the data storage device, thereby resulting in performance decreases. Optimizing thermal throttling processes based on one or more determined environmental factors can allow for more stable performance of the data storage device over time.

One embodiment of the present disclosure includes a data storage device including a non-volatile memory device having a memory block including a number of memory dies, and a controller coupled to the non-volatile memory device. The controller is configured to monitor a temperature of the data storage device and determine whether the monitored temperature exceeds a first temperature threshold. The controller is also configured to perform a default thermal throttling operation based on the monitored temperature exceeding the first temperature threshold, determine whether the monitored temperature exceeds a second temperature threshold, and perform a customized thermal throttling operation based on the monitored temperature exceeding the second temperature threshold.

Another embodiment of the present disclosure includes a method performed by a data storage device having a controller coupled to a non-volatile memory device. The method includes monitoring a temperature of the data storage device and determining whether the monitored temperature exceeds a first temperature threshold. The method also includes performing a default thermal throttling operation based on the monitored temperature exceeding the first temperature threshold, determining whether the monitored temperature exceeds a second temperature threshold, and performing a customized thermal throttling operation based on the monitored temperature exceeding the second temperature threshold.

Another embodiment of the present disclosure includes a system having one or more data storage devices. Each data storage device includes a non-volatile memory device including a memory block, the memory block including a number of memory dies. The system also includes a controller coupled to the one or more data storage devices. The controller is configured to monitor a temperature of the data storage devices, determine whether the monitored temperature of one or more of the data storage devices exceeds a first temperature threshold, and perform a customized thermal throttling operation at each of the data storage devices in response to the monitored temperature being determined to exceed the first temperature threshold.

Various aspects of the present disclosure provide for improvements in data storage devices. For example, optimizing thermal throttling processes based on various determined environmental parameters. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, etc.

Figure 1:
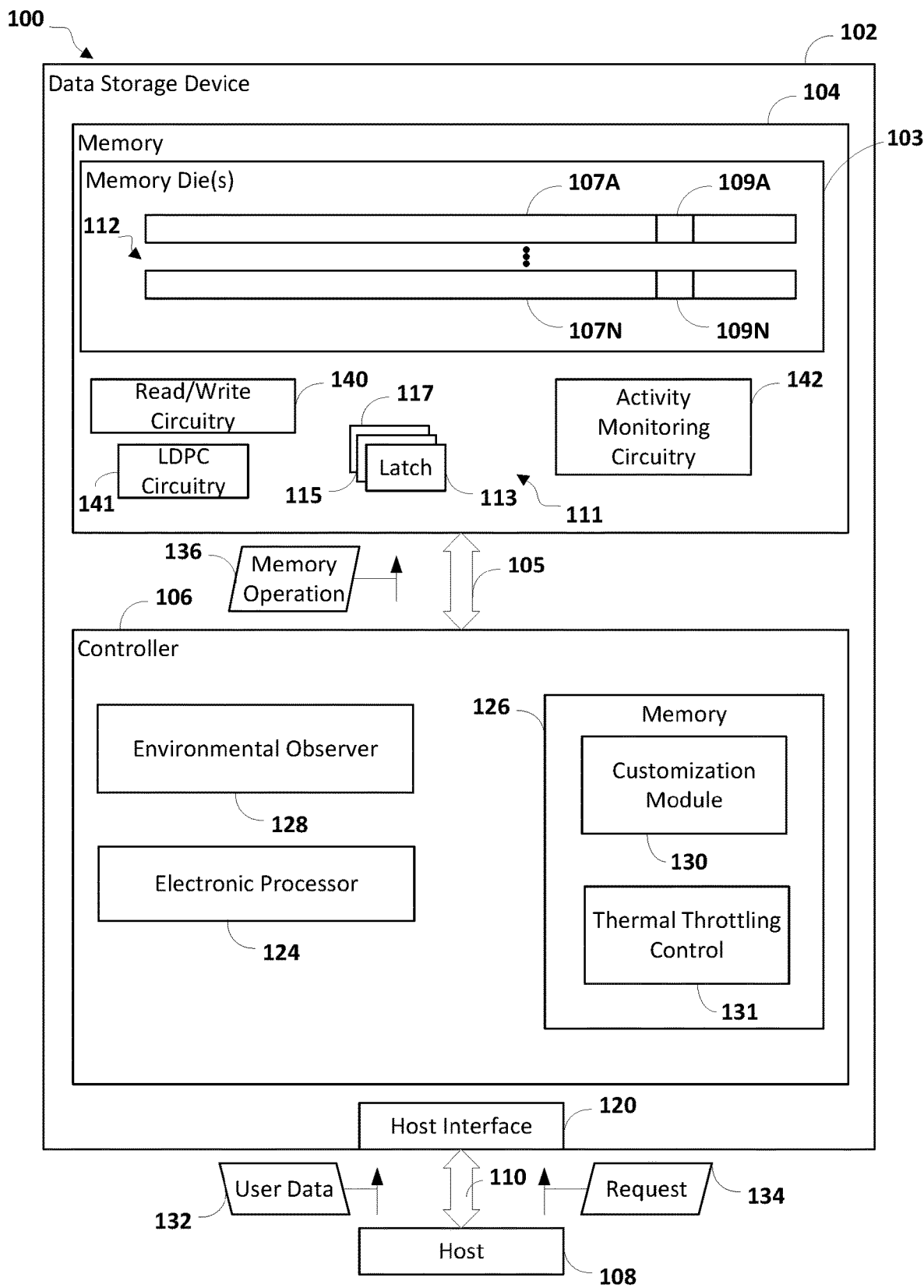
FIG. 1 is block diagram of one example of a system including a data storage device, according to some embodiments.

FIG. 1 is a block diagram of one example of a system 100 that includes thermal throttling optimization, in accordance with some embodiments of the disclosure. In the example of FIG. 1, the system 100 includes a data storage device 102 in communication with a host device 108. The data storage device 102 includes a memory device 104 (e.g. non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled via a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 via the communication path 110, such as a wired communication path and/or a wireless communication path. For example, the data storage device 102 may include an interface 120 (e.g., a host interface) that enables communication via the communication path 110 between the data storage device 102 and the host device 108, such as when the interface 120 is communicatively coupled to the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates via a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 and activity monitoring circuitry 142 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies 103 may include corresponding read/write circuitry 140 that is operable to read from and/or write to storage elements within the individual memory die independent of any other read and/or write operations at any of the other memory dies. The activity monitoring circuitry 142 may be external to the one or more memory dies 103 and to the memory device 104. For example, the activity monitoring circuitry 142 may be embodied in the controller 106 as separate hardware circuitry or firmware. Alternatively, one or more individual memory dies 103 may include corresponding activity monitoring circuitry 142 that is operable to perform one or more activity monitoring functions, described below, within the individual memory die 103 independently of any activity monitoring at any of the other memory dies 103. In some examples, one or more activity monitoring operations may be performed using the activity monitoring circuitry 142. The memory device 104 may further include one or more latches (e.g., a set of latches 111 including latches 113, 115, and 117).

The activity monitoring circuitry 142 may be formed using logic gates such as AND, OR, XOR, and NOT gates, or programmable logic gates. In other examples, the activity monitoring circuitry 142 may be omitted from the memory device 104, and operations described with reference to the activity monitoring circuitry 142 may be performed by the read/write circuitry 140. In still further examples, the activity monitoring circuitry 142 may be omitted from the memory device 104, and operations described with reference to the activity monitoring circuitry 142 may be performed by the controller 106.

The controller 106 is coupled to the memory device 104 (e.g., the one or more memory dies 103) via a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 via the interface 120, and the controller 106 may receive data from the host device 108 via the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a toggle mode circuitry 125, a memory 126, and other associated circuitry such as an environmental observer 128. The memory 126 may be configured to store data and/or instructions that may be executable by the processor 124. The memory 126 may include a customization module 130 and a thermal throttling control 131, among other applications, programs, etc. The customization module 130 and/or the thermal throttling control 131 may be a hardware circuit or instructions that are executable by the processor 124.

The environmental observer 128 is configured to detect or determine one or more environmental factors, such as ambient temperature, data storage device temperatures, cooling airflow, air circulation speed, cooling fan speed, cooling fan current, liquid coolant temperature, etc. For example, in some embodiments, a temperature of each memory block 112 can be determined by the environmental observer 128. In other embodiments, a single temperature of the data storage device 102 is determined by the environmental observer 128. The environmental observer 128 is configured to provide the determined temperature information to the processor 124. While the environmental observer 128 of FIG. 1 is shown as part of the controller 106, it is understood that one or more environmental observers may be located within the data storage device 102 to provide environmental data for one or more portions of the data storage device 102.

Figure 2:
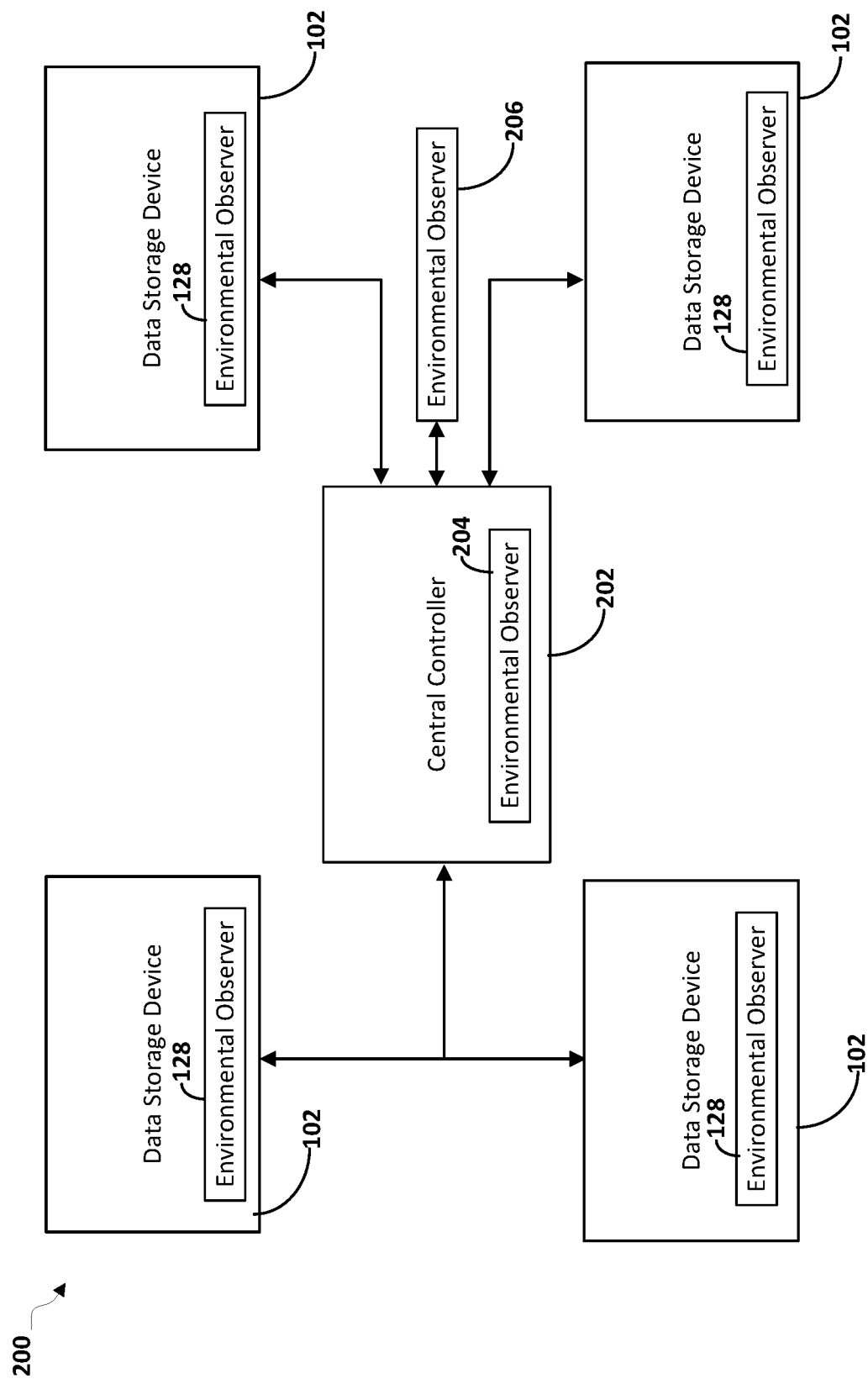
FIG. 2 is a block diagram of one example of a system including multiple data storage devices, according to some embodiments.

Turning now to FIG. 2, a diagram illustrating a system 200 having multiple data storage devices, such as data storage device 102 described above, is shown according to some embodiments. As described above, each data storage device 102 may include one or more environmental observers, such as environmental observer 128 described above. The system 200 further includes a central controller 202.

The central controller 202 may be a supervisory controller configured to provide operational control of the one or more data storage devices 102 within the system 200. The central controller 202 may communicate with the one or more data storage devices 102 using one or more known communication and control protocols such as I$^2$C, RS-232, RS-485, Firewire, Universal Serial Bus ("USB"), SATA, PCIe, NVMe, and other communication and control protocols as appropriate for a given application. As further shown in FIG. 2, the central controller 202 may include a central controller environmental observer 204. The central controller environmental observer 204 may be configured to perform similar functions as the environmental observer 128 described above. In some examples, the system 200 may further include one or more system environmental observers 206. The system environmental observers 206 may be configured to determine one or more environmental parameters of the system, such as system temperature, cooling airflow, air circulation speed, cooling fan speed, cooling fan current, liquid coolant temperature, power consumption, outside air temperature, and/or other parameters as applicable for a given application.

As shown in FIG. 2, the central controller 202 is in communication with the one or more data storage devices 102 as described above. In some embodiments, the data storage devices 102 may provide data determined by the respective environmental observers 128 within the data storage devices 102 to the central controller 202. Similarly, the central controller 202 may receive environmental parameters from the system environmental observer 206 as well. Further, the central controller 202 may communicate one or more thermal throttling parameters or operations to the data storage devices 102, as will be described in more detail below.

Figure 3:
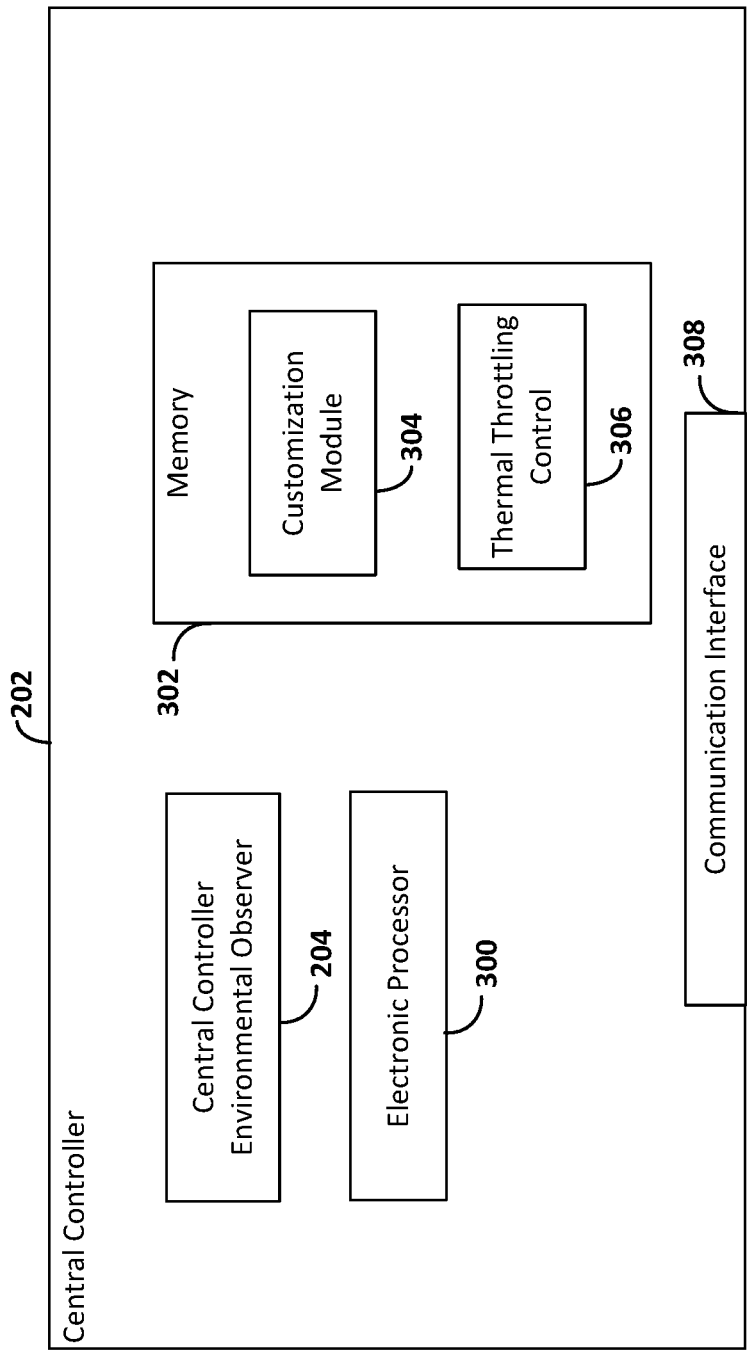
FIG. 3 is a block diagram of one example of a centralized controller, according to some embodiments.

Turning now to FIG. 3, a block diagram illustrating the central controller 202 of FIG. 2 is shown, according to some embodiments. As will be described in more detail below, the central controller 202 may be configured to control the thermal throttling of one or more data storage devices 102 within a system, such as system 200. Further, the central controller 202 may be configured to perform one or more optimizations to a thermal throttling control scheme based on environmental parameters, such as those provided by the environmental observers 128, the central controller environmental observer 204, and/or the system environmental observer 206. The central controller 202, in addition to the central controller environmental observer 204 may include an electronic processor 300 and a memory 302 in communication with the electronic processor 300. The memory may include a customization module 304 and a thermal throttling control 306. The customization module 304 and/or thermal throttling control 306 may provide similar functionality to the customization module 130 and the thermal throttling control 131 described above, respectively. However, the customization module 304 and/or thermal throttling control 306 may be configured to provide customization and or thermal throttling commands to one or more of the data storage devices 102 within the system 200.

The central controller 202 may further include a communication interface 308. The communication interface 308 is configured to provide communication between the central controller 202 and one or more other devices, such as the data storage devices 102 and/or the system environmental observer 206. Further, the communication interface 308 may be configured to communicate with one or more external devices via a networked connection, such as Wi-Fi, Cellular, WLAN, LAN, Ethernet, etc.

Figures 4A, 4B:
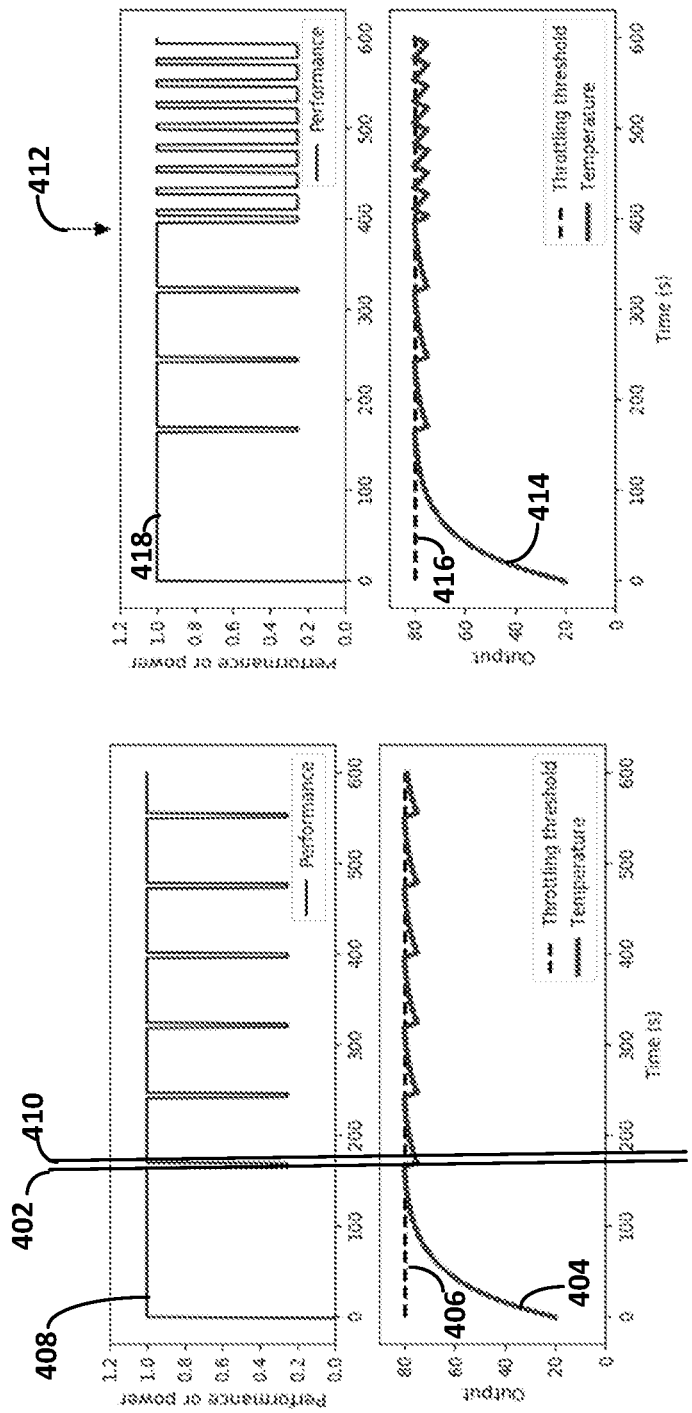
FIGS. 4a-4b is a chart illustrating performance graphs when using bang-bang thermal throttling control, according to some embodiments.

Turning now to FIGS. 4a-b, data storage device performance graphs are shown for various operating conditions when using a bang-bang control algorithm to perform thermal throttling. In FIG. 4a, a normal usage and ramp up condition is shown, according to some embodiments. As shown at point 402, the temperature 404 exceeds the throttling threshold 406 and the performance 408 is dropped to approximately 20% of the full output. While performance may be measured using various benchmarks, for purposes of this example, performance is measure in Inputs and Outputs per Second ("IOPS"). As the temperature falls back below the throttling threshold, at point 410, the performance is increased back to 100%. This process continues as the temperature exceeds throttling threshold and then falls below the throttling threshold as shown in FIG. 4a.

Turning now to FIG. 4b, at point 412 an environmental change, such as a sudden reduction of cooling occurs. Examples of reduction of cooling may include loss of power to cooling fan, airflow over a heatsink being obstructed, an increase in ambient air temperature, etc. This results in the temperature 414 rapidly exceeding the throttling threshold 416 after throttling is removed, requiring a subsequent temperature throttling event to occur again rapidly after the previous thermal throttling event has ended. This rapid oscillation of the thermal throttling events results in the performance 418 rapidly oscillating between full performance and a substantially reduced performance (e.g. 20%). This oscillation in performance 418 may reduce the overall operational efficiency of a data storage device, such as data storage device 102.

Figures 5A, 5B:
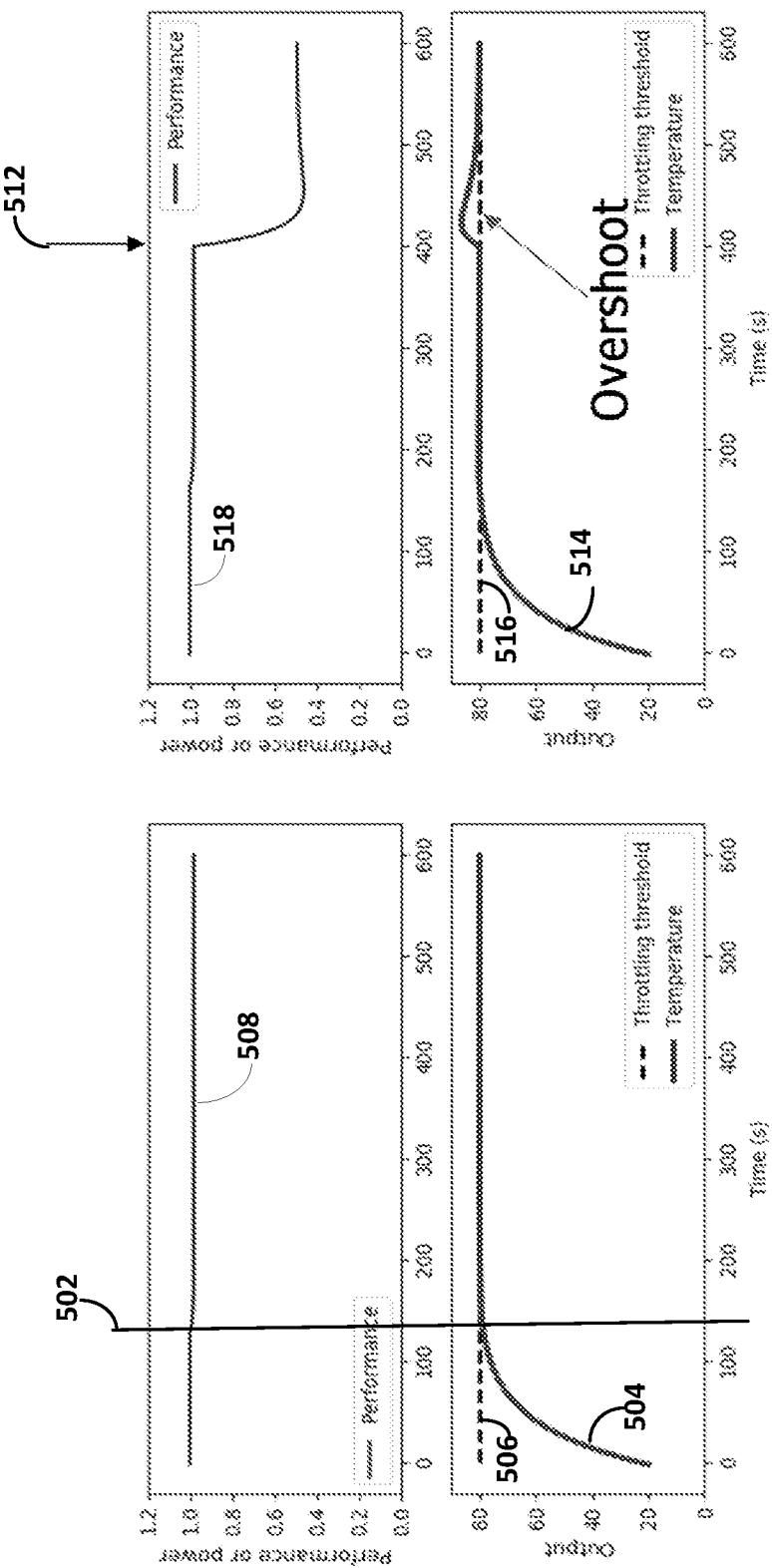
FIGS. 5a-5b is a chart illustrating performance graphs when using PID control, according to some embodiments.

Turning now to FIGS. 5a-b, data storage device performance graphs are shown for various operating conditions when using a proportional-integral-derivative ("PID") control algorithm to perform thermal throttling. In FIG. 5a, a normal usage and ramp up condition is shown, according to some embodiment. As shown at point 502, the temperature 504 approaches throttling threshold 506. The PID control algorithm slightly reduces the performance 508 (e.g. 5% reduction) and maintains the reduced performance over time.

Turning now to FIG. 5b, at point 512 an environmental change, such as a sudden reduction of cooling occurs. Examples of reduction of cooling may include loss of power to cooling fan, airflow over a heatsink being obstructed, an increase in ambient air temperature, etc. This sudden reduction of cooling can cause the temperature 514 to overshoot the throttling threshold 516, which in turn may cause the PID control algorithm to substantially reduce the performance 518 (e.g. by 50%) to get the temperature 514 below the throttling threshold 516. This reduction in performance 518 may reduce the overall operational efficiency of a data storage device, such as data storage device 102.

The examples described above in FIGS. 4a-4b and 5a-5b illustrate difficulties in managing thermal throttling of data storage devices where there are environmental changes, as may occur based on an installation application or location of the data storage device 102. The following embodiments describe various techniques for optimizing thermal throttling for one or more data storage devices in response to varying applications and/or environmental changes.

Figure 6:
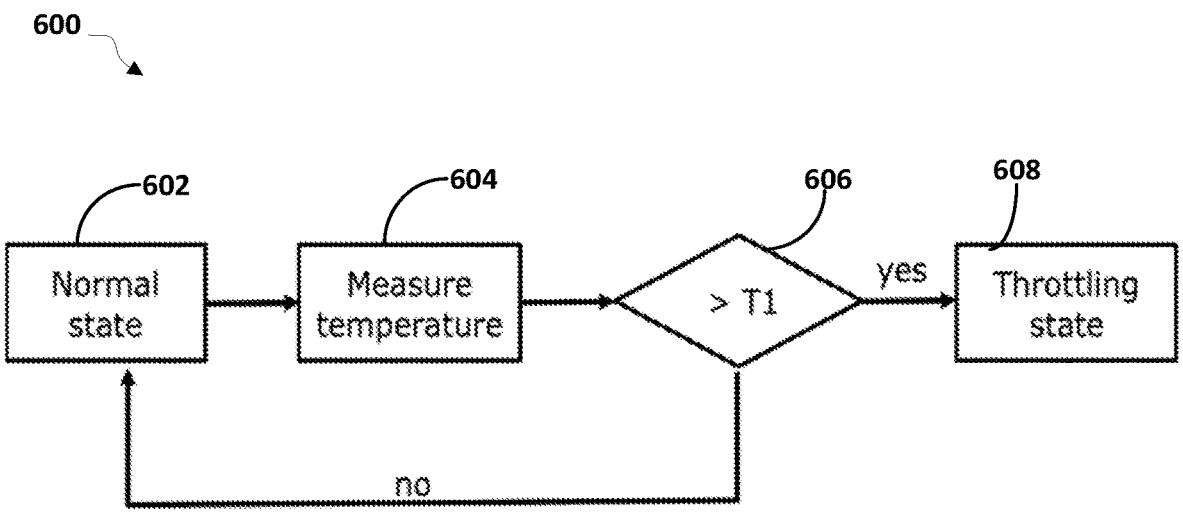
FIG. 6 is a flow chart illustrating a thermal throttling process, according to some embodiments.

Turning now to FIG. 6, a standard thermal throttling process 600 for a data storage device, such as data storage device 102, is shown, according to some embodiments. In some embodiments, the thermal throttling process 600 may be performed using one or more of the bang-bang and PID control processes described above. However, other standard throttling processes are contemplated. Furthermore, as described above, the controller 106 of the data storage device 102 may perform the process 600. However, while the process 600 is described as being performed by the controller 106 of the data storage device 102, it is contemplated that in some applications a central controller, such as central controller 202 may perform the process 600. At process block 602, the data storage device 102 operated in a normal state. At process block 604 a temperature of the data storage device 102 is determined. At process block 606, the controller 106 determines whether the determined temperature exceeds a first temperature threshold. In some embodiments, the first temperature threshold may be in a range between 70° C. and 90° C. However, first temperature threshold values of less than 70° C. and more than 90° C. are also contemplated. In response to determining that the determined temperature does not exceed the first temperature threshold, the normal operating state is maintained at process block 602. In response to determining that the determined temperature does exceed the first temperature threshold, the controller 106 executes a throttling operation, such as the bang-bang or PID controls described above.

Figure 7:
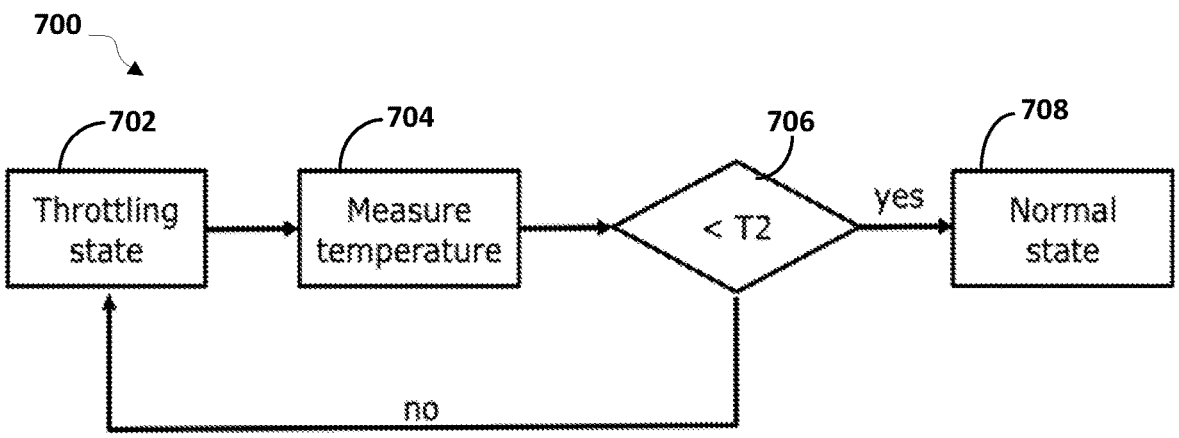
FIG. 7 is a flow chart illustrating a process for exiting a thermal throttling operation, according to some embodiments.

Turning now to FIG. 7, a process 700 for exiting a thermal throttling operation is shown, according to some embodiments. As described above, the controller 106 of the data storage device 102 may perform the process 700. However, while the process 700 is described as being performed by the controller 106 of the data storage device 102, it is contemplated that in some applications a central controller, such as central controller 202 may perform the process 700. At process block 702, the data storage device 102 is operated in a throttled condition, such as that described above in regards to process 600. At process block 704, a temperature of the data storage device 102 is determined. At process block 706, the controller 106 determines whether the determined temperature is below a second temperature threshold. In some embodiments, the second temperature threshold is less than the first temperature threshold described in regards to process 600. In other embodiments, the second temperature threshold may be the same as the first temperature threshold described in regards to process 600. In response to determining that the determined temperature is not less than the second temperature threshold, the throttled operating state is maintained at process block 702. In response to determining that the determined temperature is less than the second temperature threshold, the controller 106 returns to a normal (e.g. not throttled) operating state at process block 708.

Figure 8:
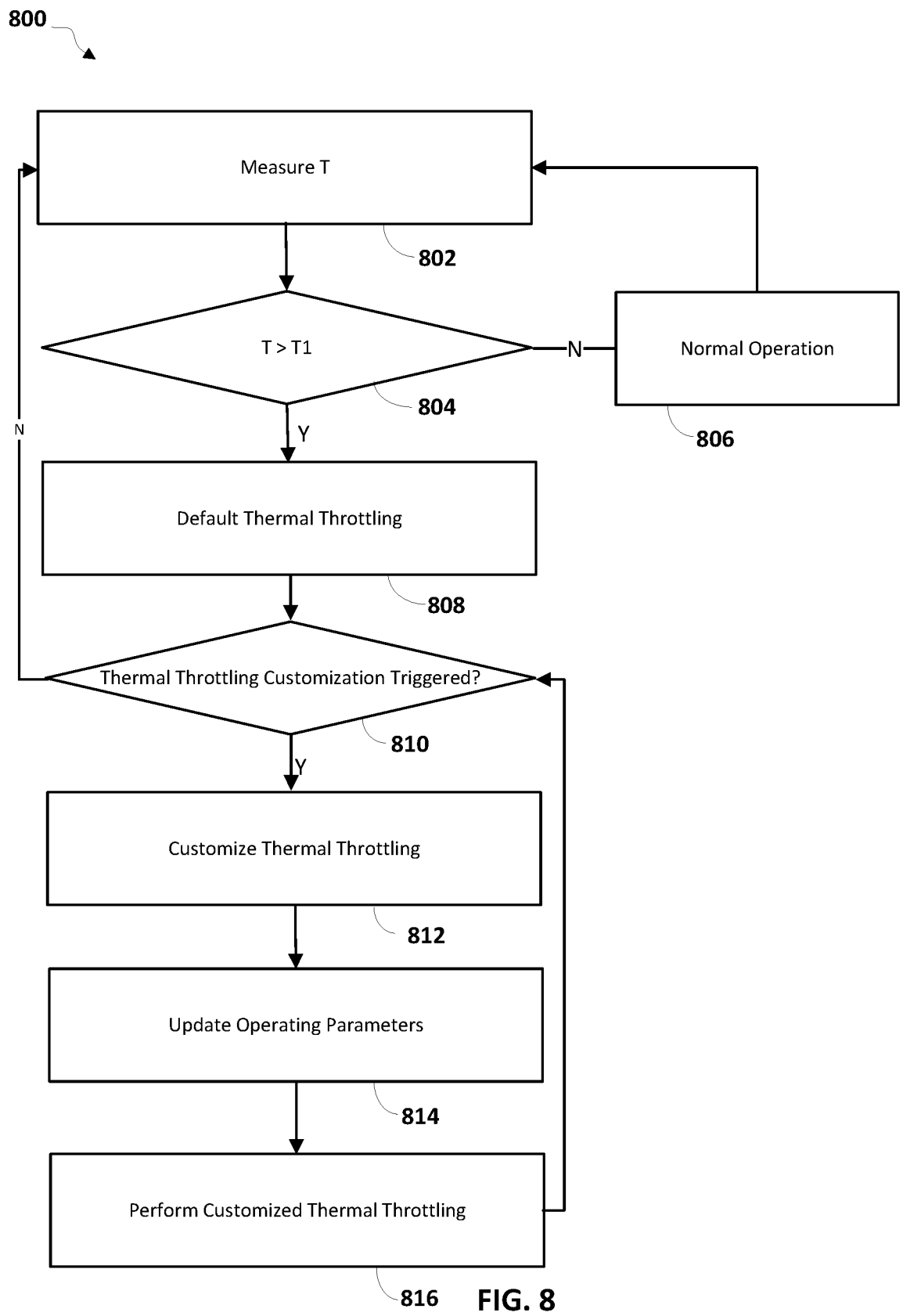
FIG. 8 is a flowchart illustrating a process for performing a thermal throttling operation of a data storage device, according to some embodiments.

Turning now to FIG. 8, a process 800 for performing a customized thermal throttling operation of a data storage device, such as data storage device 102, is shown, according to some embodiments. The process 800 is described as being executed using a controller, such as controller 106, of a data storage device 102. However, it is understood that the process 800 may be performed by one or more other controllers, such as central controller 202, described above. Further, while the process 800 is generally described in relation to a single data storage device 102, it is contemplated that the process 800 may be applied to one or more data storage devices 102 in a system, such as system 200 described above.

At process block 802, a temperature of the data storage device 102 is determined. In some embodiments, the temperature is measured via the environmental observer 128, which may include one or more temperature sensors as described above. At process block 804, the controller 106 determines whether the measured temperature exceeds a temperature throttling threshold. In response to determining that the measured temperature does not exceed the temperature throttling threshold, the controller 106 continues to operate the data storage device 102 in a normal operation mode (e.g. no thermal throttling applied), at process block 806.

In response to determining that the measured temperature exceeds the temperature throttling threshold, default thermal throttling is performed at process block 808 based on one or more optimization parameters. For example, the default thermal throttling performed at process block 808 may utilize bang-bang or PID control, as described above. In some embodiments, the default thermal throttling performed at process block 808 may be based on a default thermal model and associated throttling algorithm for a given data storage device 102. For example, the default thermal model and associated throttling algorithms may be set at the manufacturing facility at the time of production of the data storage device 102.

At process block 810, the controller 106 determines whether a thermal throttling customization is triggered. In some embodiments, the thermal throttling customization may be triggered where the measured temperature exceeds a customization temperature threshold, $T_{op}$. In other embodiments, the thermal throttling customization may be triggered based on changes to one or more environmental parameters, such as those measured by an environmental observer, such as environmental observer 128. Example environmental parameters may include ambient air temperature, air circulation speed around the data storage device 102, cooling fan speed, cooling fan current, etc. In some embodiments, the environmental observer 128 is a model estimator that determines or estimates one or more model parameters (e.g. environmental data) based on various inputs, such as input power, temperature, etc.

In response to the thermal throttling customization not being triggered, the controller 106 continues to monitor the temperature of the data storage device 102 at process block 802. In response to the thermal throttling customization being triggered, a customization process is performed at process block 812 to generate updated operating parameters for use in thermally throttling the data storage device 102, as will be described in more detail below. For example, the updated operating parameters may include updated thermal models for the data storage device 102, updated thermal throttling algorithms, updated throttling parameters (e.g. temperature thresholds, etc.). In one embodiment, the customization module 130 and/or the customization module 304 may perform the customization process. At process block 814, one or more thermal throttling algorithms are updated at process block 814 as are determined based on outputs of the customization process performed at process block 812. The controller 106 then performs the customized thermal throttling process at process block 816. The customized thermal throttling processes may be based on of one or more parameters, such as input power ("Q"), performance (e.g. IOPS), and/or reference temperature $T_r$, as will be described in more detail below. In some embodiments, optimization of the Q, performance, and/or $T_r$ determines how the thermal throttling process is customized. In some examples, the thermal throttling control 131 and/or the thermal throttling control 306 performs the customized thermal throttling process.

Figure 9:
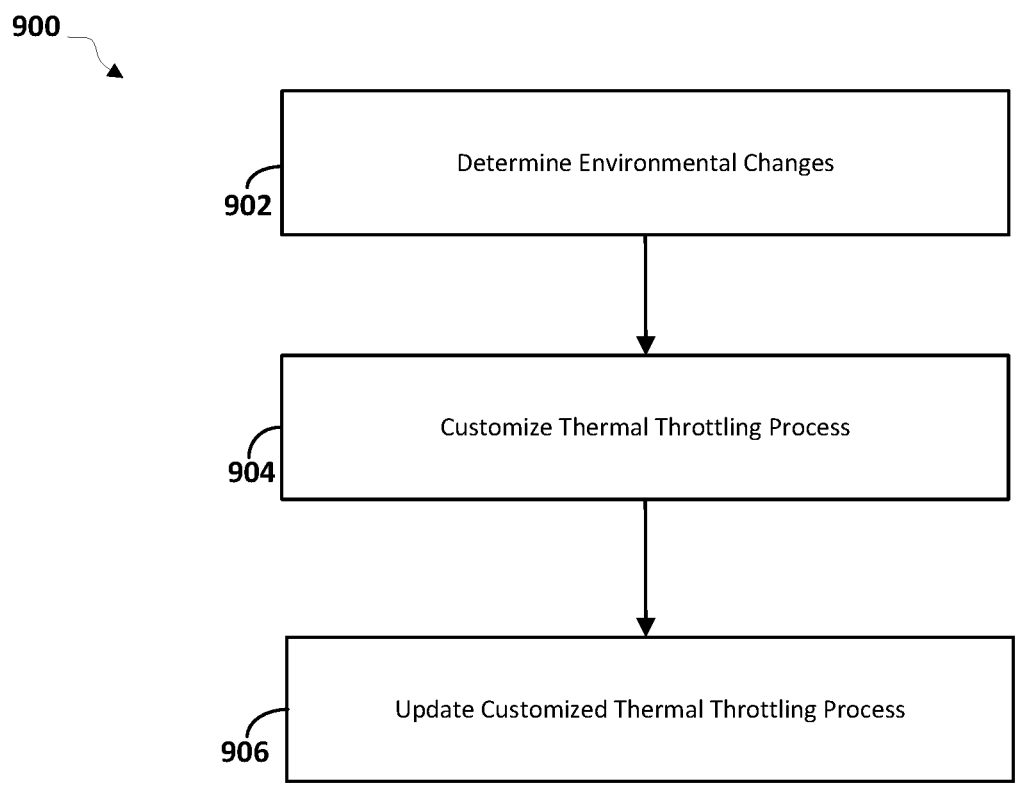
FIG. 9 is a flowchart illustrating a process for customizing a thermal throttling operation of a data storage device, according to some embodiments.

Turning now to FIG. 9, a process 900 for customizing the thermal throttling operation of a data storage device, such as data storage device 102, is shown, according to some embodiments. In one embodiment, the process 900 is a sub-process detailing the customization process performed at process block 812 in process 800. For example, the process 900 is generally performed in response to a thermal throttling optimization event being triggered, as described above.

At process block 902, one or more environmental changes are determined. As described above, one or more environmental observers, such as environmental observer 128, central controller environmental observer 204 or system environmental observer 206 may provide environmental changes. As noted above, example environmental changes may include air temperature, air circulation speed, cooling fan speed, cooling fan current, etc. Upon determining the environmental changes, a thermal throttling process for one or more data storage devices 102 is customized, based at least in part on the determined environmental changes, at process block 904.

The thermal behavior of one or more data storage devices 102 may be described by a physical thermal model. For example, data storage devices 102 may be modeled based on the following model equation:

$$mc_p \frac{dT}{dt} = UA(T_{air} - T) + Q;$$

wherein U is a heat transfer coefficient, A is the area of the data storage device 102, $T_{air}$ temperature of the air around the data storage device 102, $mc_p$ is the thermal mass of the data storage device 102, and Q is the input power to the device. Generally, variations in $T_{air}$ or U may be used to trigger the customization process described above. Using the above model, Q and/or workload (e.g. performance) may be calibrated for each device. In some embodiments, the thermal model is updated based on inputs from one or more environmental observer, such as with regards to changes in $T_{air}$. The thermal model is then used as a constraint in one or more objective functions, as described below. In some embodiments Q may be directly correlated to performance (e.g. IOPS). The above model may be used in model predictive control ("MPC") used by a controller, such as controller 106 and/or central controller 202 to optimize the thermal throttling of one or more data storage devices 102. In some embodiments, one or more environmental observers may utilize MPC in conjunction with a respective controller to customize the thermal throttling of one or more data storage device 102. In some embodiments, the one or more environmental observers 128 may be configured to update one or more parameters of the thermal model described above. In some embodiments, the parameters of the thermal model may be updated before the customization process described above is initiated.

In one embodiment, Q and/or performance for a single data storage device 102 may be customized at process block 904. In one embodiment, an objective function (named as J) can be generated based on various conditions, such as application of the data storage device 102 and/or one or more environmental factors associated with the installation of the data storage device 102. The objective function J may be used in conjunction with the MPC described above to customize thermal throttling of one or more data storage devices 102. In one embodiment, the objective function is used to optimally control the thermal throttling of the data storage device 102 to compute operational variables such as performance or Q. As will be described in more detail below, certain constraints may be included in the objective function, such as power limits, cooling fan limits, performance limits, etc. Further constraints may include a temperature shutdown threshold $T_s$, which represents a temperature threshold that will cause the data storage device 102 to shutdown in response to $T_s$ being exceeded. In some embodiments, a user may configure the objective functions to prioritize one or more parameters, such as performance, Q, or reference temperature, as described below.

For optimizing the Q and/or performance of a single data storage device 102, the following objective function (1) may be executed by a controller (such as controller 106):

$$\min_{Q} J = \sum_{t=0}^{T_h} \left( -Q(t) + (\Delta Q(t))^2 + (T(t) - T_r)^2 \right) \quad (1)$$

In the objective function (1), $\Delta Q = Q_{t+1} - Q_t$ and $T_h$ is the time horizon for the MPC. The constraints for the objective function (1) are $$mc_p \frac{dT}{dt} = UA(T_{air} - T) + Q; T(t) < T_s \text{ for } \le t \le T_h.$$

Based on the above equations, the controller 106, such as via the customization module 130, computes the customized design variable $Q = [Q_1, Q_2, \ldots, Q_{T_h}]$ (index is for the time step), given the parameters U, A, $T_{air}$, $mc_p$, $T_r$, and a measurement of T. $T_r$ is a reference temperature at which the data storage device 102 is determined to operate safely. In some embodiments, $T_r$ may equal $T_{op}$.

In other embodiments, $T_r$ may be optimized along with Q and/or performance for a single data storage device 102. Optimizing $T_r$ allows the data storage device 102 to be operate at or around $T_r$. In some embodiments, Tr is optimized every time optimal throttling is triggered. In other embodiments, Tr is optimized based on changes to one or more environmental parameters, as described above, as the optimization of $T_r$ is generally computationally intensive. Optimization of $T_r$ may be useful where the data storage device 102 is installed in an environment with good cooling, thereby allowing $T_r$ to be a higher temperature. To optimize Q and/or performance in addition to $T_r$, the following objective function (2) may be executed by a controller (such as controller 106):

$$\min_{Q,T_r} J = \sum_{t=0}^{T_h} \left( -Q(t) + (\Delta Q(t))^2 + (T(t) - T_r)^2 \right) \quad (2)$$

In the objection function (2), $\Delta Q = Q_{t+1} - Q_t$ and $T_h$ is the time horizon for the MPC. The constraints for the objective function (2) are:

$$mc_p \frac{dT}{dt} = UA(T_{air} - T) + Q; T(t) < T_s \text{ for } 0 \le t \le T_h; T_{op} \le T_r \le T_s.$$

Based on the above equation, the controller 106, such as via the customization module 130, computes the custom design variables Q (performance) and $T_r$, given the parameters U, A, $T_{air}$, $m_{cp}$, and T.

In some examples, the performance or Q may be optimized for systems, such as system 200, having multiple data storage devices 102 and/or data storage device 102 with multiple hotspots. For example, a single data storage device 102 may include multiple hotspots, such as on the flash memory die and/or the controller 106, and thereby have multiple thermal throttling thresholds. Further, a system, such as system 200, may have multiple devices having multiple throttling settings and thresholds. In some examples, a global controller, such as central controller 202, may be used to customize thermal throttling for multiple data storage devices 102. In some examples, the central controller 202 may override thermal throttling settings, such as default thermal throttling settings, for individual data storage devices.

In one embodiment, performance and/or Q for multiple devices (or devices with multiple hotspots), may be optimized using the following objective function (3) executed by a controller (such as controller 106 and/or central controller 202):

$$\min_{Q_i} J = \sum_{t=0}^{T_h} \sum_{i} \left( -Q_i(t) + (\Delta Q_i(t))^2 + (T_i(t) - T_{r,i})^2 \right) \quad (3)$$

In the objective function (3), $\Delta Q = Q_{t+1} - Q_t$, $T_h$ is the time horizon for the MPC, and i indicates the i-th device. The constraints for the objective function (3) are:

$$mc_{p_i} \frac{dT_i}{dt} = U_i A_i (T_{air_i} - T_i) + Q_i;$$

and $T_i(t) < T_{s,i}$ for $0 \le t \le T_h$. For downstream devices the air temperature $T_{air_i}$ is determined by air temperature of upstream device and its associated power, such as via the function $T_{air_{i+1}} = f(T_{air_i}, Q_i)$. However, other functions are also contemplated as appropriate for a given application. Based on the above equations, the controller 106 and/or central controller 202 compute the custom design variable $Q_i$, given the parameters $U_i$, $A_i$, $T_{air\_i}$, $Mcp_i$, $T_{ri}$ and measurement of T.

In other embodiments, performance and/or Q and Tr for multiple devices (or devices with multiple hotspots), may be optimized using the following objective function (4):

$$\min_{Q_i, T_{r,i}} J = \sum_{t=0}^{T_h} \sum_{i} \left( -Q_i(t) + (\Delta Q_i(t))^2 + (T_i(t) - T_{r,i})^2 \right) \quad (4)$$

In the objective function (4), $\Delta Q = Q_{t+1} - Q_t$, $T_h$ is the time horizon for the MPC, and i indicates the i-th device. The constraints for the objective function (4) are $$mc_{p_i} \frac{dT_i}{dt} = U_i A_i (T_{air_i} - T_i) + Q_i; T_{air_{i+1}} = f(T_{air_i}, Q_i);$$

$T_i(t) < T_{s,i}$ for $0 \le t \le T_h$; and $T_{op,i} < T_{r,i} < T_{s,i}$, for $0 \le t \le T_h$.

Based on the above equations, the controller 106 and/or the central controller 202, computes the custom design variable $Q_i$ and $T_{r,i}$, given the parameters $U_i$, $A_i$, $T_{air\_i}$, $Mcp_i$ and measurement of $T_i$.

In still another embodiment, performance and/or Q and $T_r$ may be optimized within a system, such as system 200, having different types of data storage devices 102. Specifically, where the system includes solid state data storage devices and hard disk drive ("HDD") data storage devices.

HDDs are sensitive to acoustic noise and vibrations induced by cooling fans. Cooling fan speeds affects the heat transfer coefficient (U) for a given data storage device 102. Thus, using the following objective function (5), the cooling fan speed can be minimized while maintaining the system at an overall optimal state:

$$\min_{Q_i, T_{r,i}, U_i} J = \sum_{t=0}^{T_h} \sum_i \left( -Q_i(t) + (\Delta Q_i(t))^2 + (T_i(t) - T_{r,i})^2 + U_i^2 \right) \quad (5)$$

In the objective function (5), $\Delta Q = Q_{t+1} - Q_t$, $T_h$ is the time horizon for the MPC, and i indicates the i-th device. The constraints for the objective function (5) include $$mc_{p_i} \frac{dT_i}{dt} = U_i A_i (T_{air_i} - T_i) + Q_i; \ T_{air_{i+1}} = f(T_{air_i}, Q_i);$$

$$T_i(t) < T_{s,j} \text{ for } 0 \le t \le T_h; \ T_{op,i} < T_{r,i} < T_{s,i}, \text{ for } 0 \le t \le T_h;$$

Umax>$U_i \ge U_{min}$. Based on the above equations, the controller 106 and/or central controller 202 computes the custom design variables $Q_i$, $T_{r,i}$, and $U_i$, given the parameters $A_i$, $T_{air\_i}$, $Mcp_i$ and measurement of $T_i$.

The objective function 5) may optimize Q, T, and U (equating to cooling fan speed). As noted above, SSD prefer larger cooling fan speed ($U_i$) to allow for increased performance (e.g. IOPS), while HDDs generally prefer lower cooling fan speed ($U_i$) as a high cooling fan speed may introduce mechanical disturbances thereby reducing the performance (e.g. IOPS) of the HDD. Thus, the objective function 5 attempts to determine a cooling fan speed ($U_i$), such that both HDDs and SSDs in a given system reach a performance that is optimal for the overall system. For example, if Q is increased alone (favoring SSD), a larger $U_i$ will be needed to allow for the increase in Q (e.g. performance), increasing J. Similarly, if $U_i$ is reduced alone (favoring HDD), the Q of the SSD will be reduced due to the decrease in $U_i$ and J increases. Thus, objective function 5 attempts to determine the best performance for the entire system by including both Q and $U_i$ in the determination of J, rather than just optimizing for one type of drive within the system.

Returning now to FIG. 9, the customized thermal throttling process is updated based on the one or more objective functions described above at process block 906. The updated customized thermal throttling process may then be used to perform customized thermal throttling, as described above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a non-volatile memory device including a memory block, the memory block including a plurality of memory dies;
an environmental observer configured to determine one or more environmental parameters associated with the data storage device; and
a controller coupled to the non-volatile memory device and configured to:
monitor a temperature of the data storage device,
determine whether the monitored temperature exceeds a first temperature threshold,
perform a default thermal throttling operation based on the monitored temperature exceeding the first temperature threshold,
determine whether the monitored temperature exceeds a second temperature threshold,
perform a customized thermal throttling operation based on the monitored temperature exceeding the second temperature threshold, and
update the customized thermal throttling operation based on the determined environmental parameters.

2. The data storage device of claim 1, wherein the one or more environmental parameters include one or more of an air temperature, an air circulation speed, a cooling fan speed, and a cooling fan current.

3. The data storage device of claim 1, wherein the controller is configured to update the customized thermal throttling operation using one or more objective functions, wherein the one or more objective functions update the customized thermal throttling operation to optimize one or more design variables associated with the data storage device.

4. The data storage device of claim 3, wherein the one or more design variables include one or more of a performance variable, an input power variable, and a reference temperature variable.

5. The data storage device of claim 1, wherein the second temperature threshold is greater than the first temperature threshold.

6. A method performed by data storage device having a controller coupled to a non-volatile memory device, the method comprising:
- determining one or more environmental parameters associated with the data storage device;
- monitoring a temperature of the data storage device;
- determining whether the monitored temperature exceeds a first temperature threshold;
- performing a default thermal throttling operation based on the monitored temperature exceeding the first temperature threshold;
- determining whether the monitored temperature exceeds a second temperature threshold;
- performing a customized thermal throttling operation based on the monitored temperature exceeding the second temperature threshold, and
- updating the customized thermal throttling operation based on the determined environmental parameters.

7. The method of claim 6, wherein the one or more environmental parameters include one or more of an air temperature, an air circulation speed, a cooling fan speed, and a cooling fan current.

8. The method of claim 6, further comprising updating the customized thermal throttling operation using one or more objective functions, wherein the one or more objective functions update the customized thermal throttling operation to optimize one or more design variables associated with the data storage device.

9. The method of claim 8, wherein the one or more design variables include one or more of a performance variable, an input power variable, and a reference temperature variable.

10. The method of claim 9, wherein the reference temperature variable is a target operating temperature.

11. A system, comprising:
- one or more data storage devices, wherein each data storage device comprises a non-volatile memory device including a memory block, the memory block including a plurality of memory dies;
- one or more environmental observers configured to determine one or more environmental parameters associated with the one or more data storage devices; and
- a controller coupled to the one or more data storage devices and configured to:
  - monitor a temperature of the data storage devices,
  - determine whether the monitored temperature of one or more of the data storage devices exceeds a first temperature threshold, and
  - perform a customized thermal throttling operation at each of the data storage devices in response to the monitored temperature being determined to exceed the first temperature threshold; and
  - update the customized thermal throttling operation based on the determined environmental parameters.

12. The system of claim 11, wherein the one or more environmental parameters include one or more of an air temperature, an air circulation speed, a cooling fan speed, and a cooling fan current.

13. The system of claim 11, wherein the controller is configured to update the customized thermal throttling operation using one or more objective functions, wherein the one or more objective functions update the customized thermal throttling operation to optimize one or more design variables associated with the one or more data storage devices.

14. The system of claim 13, wherein the one or more design variables include one or more of a performance variable, an input power variable, and a reference temperature variable.

* * * * *